(12) United States Patent
Wang et al.

(10) Patent No.: US 10,854,658 B2
(45) Date of Patent: Dec. 1, 2020

(54) IMAGE SENSOR WITH SIDEWALL PROTECTION AND METHOD OF MAKING SAME

(71) Applicant: TAIWAN SEMICONDUCTOR MANUFACTURING COMPANY, LTD., Hsinchu (TW)

(72) Inventors: Chiao-Chi Wang, Hsinchu (TW); Chung-Chuan Tseng, Hsinchu (TW); Chia-Ping Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/506,455

(22) Filed: Jul. 9, 2019

(65) Prior Publication Data

US 2020/0020734 A1    Jan. 16, 2020

Related U.S. Application Data

(60) Provisional application No. 62/698,477, filed on Jul. 16, 2018.

(51) Int. Cl.
    *H01L 27/146* (2006.01)

(52) U.S. Cl.
    CPC .... *H01L 27/14636* (2013.01); *H01L 27/1461* (2013.01); *H01L 27/1462* (2013.01); *H01L 27/1463* (2013.01); *H01L 27/14607* (2013.01); *H01L 27/14612* (2013.01); *H01L 27/14625* (2013.01); *H01L 27/14643* (2013.01); *H01L 27/14683* (2013.01); *H01L 27/14685* (2013.01); *H01L 27/14689* (2013.01)

(58) Field of Classification Search
    CPC ......... H01L 27/14605; H01L 27/14607; H01L 27/1461; H01L 27/14612; H01L 27/1462; H01L 27/14625; H01L 27/1463; H01L 27/14636; H01L 27/14643; H01L 27/14683; H01L 27/14685; H01L 27/14689
    See application file for complete search history.

(56) References Cited

U.S. PATENT DOCUMENTS

| | | | |
|---|---|---|---|
| 6,580,109 B1 | 6/2003 | Thomas et al. | |
| 7,615,399 B2* | 11/2009 | Lee | H01L 27/14623 257/292 |
| 2005/0088551 A1* | 4/2005 | Lee | H04N 17/002 348/272 |

(Continued)

*Primary Examiner* — Stephen W Smoot
(74) *Attorney, Agent, or Firm* — Hauptman Ham, LLP

(57) ABSTRACT

An image sensor includes a photodiode within a semiconductor substrate and an interconnect structure over the semiconductor substrate. The interconnect structure includes a contact etch stop layer (CESL), a plurality of dielectric layers over the CESL and a plurality of metallization layers in the plurality of dielectric layers. At least one dielectric layer of the plurality of dielectric layers includes a low-k dielectric material. An opening is extended through the plurality of dielectric layers to expose a portion of the CESL above an active region of the photodiode. A cap layer is on sidewalls of the opening. The cap layer includes a dielectric material having a higher moisture resistance than the low-k dielectric material.

20 Claims, 13 Drawing Sheets

(56) References Cited

U.S. PATENT DOCUMENTS

| | | | |
|---|---|---|---|
| 2009/0278967 A1* | 11/2009 | Toumiya | H01L 27/14685 |
| | | | 348/294 |
| 2009/0315131 A1 | 12/2009 | Hung et al. | |
| 2011/0024857 A1* | 2/2011 | Toumiya | H01L 21/02263 |
| | | | 257/432 |
| 2011/0316106 A1* | 12/2011 | Kim | H01L 27/14645 |
| | | | 257/432 |
| 2012/0205731 A1 | 8/2012 | Henderson et al. | |
| 2014/0070288 A1* | 3/2014 | Tomimatsu | H01L 27/14625 |
| | | | 257/292 |
| 2016/0276380 A1* | 9/2016 | Yang | H01L 27/14607 |
| 2017/0012070 A1* | 1/2017 | Chung | H01L 27/14623 |

\* cited by examiner

IMAGE SENSOR WITH SIDEWALL PROTECTION AND METHOD OF MAKING SAME

BACKGROUND

Complementary metal-oxide semiconductor (CMOS) image sensors convert photon energy to digital data that is able to be represented as digital images. CMOS image sensors are widely used in digital cameras, cellular phones, security cameras, as well as medical, automobile, and other applications. The capability of detecting single photons with picosecond temporal resolution makes single photon avalanche diodes (SPADs) a popular choice for advanced CMOS image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
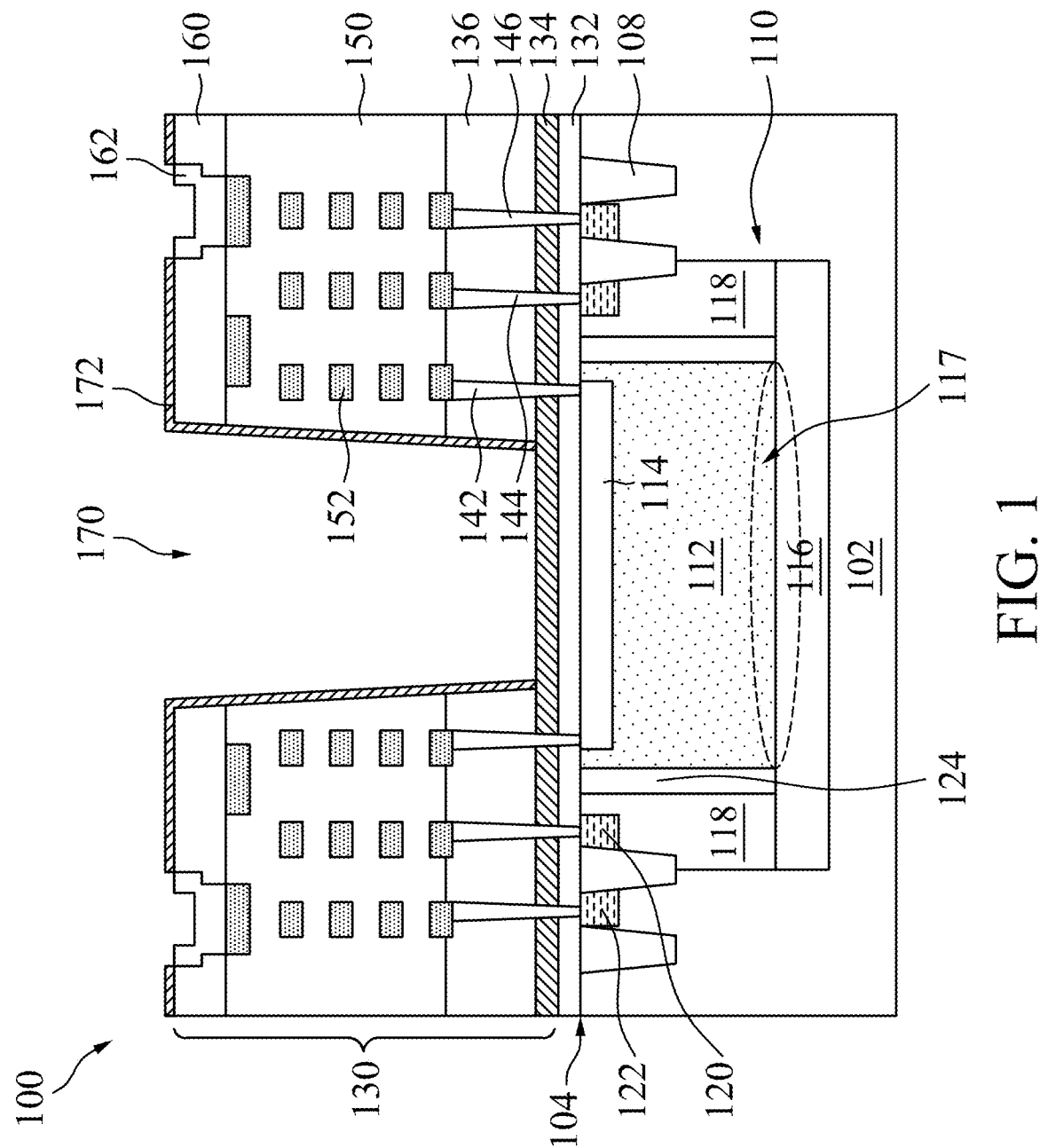
FIG. 1 is a cross-sectional view of a single photon avalanche diode (SPAD) image sensor, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A single photon avalanche diode (SPAD) is able to detect incident light at very low intensities, including single photon detection. A SPAD image sensor includes a plurality of SPADs arranged in an array within a substrate. Essentially, a SPAD is a photodiode including a p-n junction that operates at a reverse bias above a breakdown voltage. During operation, photon-generated carriers move to a depletion region (i.e., a multiplication junction region) of the p-n junction and trigger an avalanche effect such that a signal current is detected with high timing accuracy. The avalanche is quickly quenched to prevent damage to the p-n junction. The p-n junction is then reactivated by recharging the junction in excess of the breakdown voltage. The SPAD image sensor also includes an interconnect structure on top of the substrate for coupling the SPAD with peripheral circuitry. The side of the SPAD image sensor having the interconnect structure is commonly referred to as a front side.

The SPAD image sensors using front side illumination (FSI), that is, where light is received by the front side, typically suffer from low sensitivity and low quantum efficiency. In a FSI configuration, the incident light passes the interconnect structure containing a stack of dielectric layers with metal features embedded therein and then impacts the SPADs. The interconnect structure absorbs and/or reflects part of the incident light, reducing the amount of light reaching the SPADs. The sensitivity and quantum efficiency of SPAD image sensors are thereby decreased. To improve the performance of SPAD image sensors, portions of the dielectric layers in the interconnect structure directly above SPADs are removed to allow more light to pass through the interconnect structure and contact the SPADs without being absorbed/reflected by the interconnect structure. However, because the dielectric layers in the interconnect structure are typically formed of porous low-k dielectric materials, moisture is able to easily penetrate through exposed low-k dielectric sidewalls to reach the integrated circuits, causing reliability problems.

The present disclosure is related to a SPAD image sensor including a cap layer disposed on at least sidewalls of an interconnect structure for improving reliability of the image sensor. The cap layer includes a dielectric material that absorbs less moisture than the low-k dielectric materials employed in the interconnect structure. The cap layer thus helps to reduce or prevent moisture absorption by the interconnect structure. The cap layer is also configured to reflect the incident light back towards the active region of the SPAD, thus increasing photon detection probability of the SPAD.

FIG. 1 is a cross-sectional view of an image sensor 100, in accordance with some embodiments. The image sensor 100 includes one or more SPADs 110 disposed within a semiconductor substrate 102. The SPADs 110 are electrically coupled to an interconnect structure 130 disposed on a front side 104 of the semiconductor substrate 102. In some embodiments, the SPADs 110 are configured to be illuminated from the front side 104 of the semiconductor substrate 102, and operated using FSI. A cap layer 172 is on sidewalls and a topmost surface of the interconnect structure 130 to prevent moisture absorption of the interconnect structure 130.

In some embodiments, the semiconductor substrate 102 is a bulk semiconductor substrate. In some embodiments, the semiconductor substrate 102 includes an epitaxial layer. For example, in some embodiments, the semiconductor substrate 102 has an epitaxial layer overlying a bulk semiconductor substrate. In some embodiments, the semiconductor substrate 102 is a silicon-on-insulator (SOI) substrate. In some embodiments, the semiconductor substrate 102 is a silicon substrate. In alternative embodiments, the semiconductor substrate 102 is formed of other semiconductor materials such as silicon carbide, silicon germanium, III-V compound semiconductor materials (e.g., gallium arsenide, indium arsenide, or indium phosphide), or the like. In some embodiments, the semiconductor substrate 102 has a thickness ranging from about 10 micron ($\mu m$) to about 200 $\mu m$.

In some embodiments, the semiconductor substrate 102 is lightly doped with dopants of a first conductivity type, which can be a p-type or an n-type. As used herein, the term "lightly doped" refers to a doping concentration less than $1 \times 10^{15}$ dopant atoms/cm$^3$. The term "p-type" refers to the addition of impurities to an intrinsic semiconductor that creates deficiencies of valence electrons. Examples of p-type dopants, i.e., impurities, include, but are not limited to, boron, boron difluoride, gallium, and indium. "N-type" refers to the addition of impurities that contributes free electrons to an intrinsic semiconductor. Examples of n-type dopants, i.e., impurities, include, but are not limited to, antimony, arsenic, and phosphorous. In some embodiments, the semiconductor substrate 102 is doped with p-type dopants such as boron or boron difluoride.

SPAD 110 includes a first deep well 112 of the first conductivity type in the semiconductor substrate 102 and a first heavily doped region 114 of the first conductivity type in a top region of the first deep well 112. In some embodiments, the first deep well 112 extends from a front surface of semiconductor substrate 102 (i.e., from the front side 104 of semiconductor substrate 102) into the semiconductor substrate 102, and the first heavily doped region 114 is disposed within the top region of the first deep well 112 and arranged along the front surface of the semiconductor substrate 102. In some embodiments, the first deep well 112 and the first heavily doped region 114 are doped with p-type dopants such as boron or boron difluoride.

In some embodiments, the first deep well 112 has a doping concentration ranging from about $1 \times 10^{16}$ atoms/cm$^3$ to about $1 \times 10^{18}$ atoms/cm$^3$. If the doping concentration of the first deep well 112 is too high, the breakdown voltage resulting from reverse bias is reduced, in some instances. If the doping concentration of the first deep well 112 is too low, the forward current resulting from forward bias is reduced, in some instances. In some embodiments, the first deep well 112 has a uniform doping profile with a doping concentration substantially uniform at different depths. In some embodiments, the first deep well 112 is provided with a graded doping profile such that the doping concentration decreases vertically from the front surface of semiconductor substrate 102 to the bottom of the first deep well 112.

In order to provide an adequate Ohmic contact with the interconnect structure 130, the doping concentration of the first heavily doped region 114 is set to be greater than the doping concentration of the first deep well 112. The doping concentration of first heavily doped region 114 is about 50 times to about 200 times greater than the doping concentration of the first deep well 112, in some embodiments. In some embodiments, the first heavily doped region 114 has a doping concentration ranging from about $5 \times 10^{18}$ atoms/cm$^3$ to about $1 \times 10^{21}$ atoms/cm$^3$. If the doping concentration of the first heavily doped region 114 is too low, a contact resistance is high between the first heavily doped region 114 and the interconnect structure 130, in some instances. If the doping concentration of the first heavily doped region 114 is too high, the effect of Ohmic contact between the first heavily doped region 114 and the interconnect structure 130 does not change but cost increases, in some instances.

The SPAD 110 further includes a buried doped layer 116 extending beneath and in contact with the first deep well 112. The buried doped layer 116 is doped to have a second conductivity type opposite the first conductivity type. For example, when the first conductivity type is a p-type conductivity, the second conductivity type is an n-type conductivity. Alternatively, when the first conductivity type is an n-type conductivity, the second conductivity type is a p-type conductivity. In some embodiments, the buried doped layer 116 is doped with n-type dopants such as phosphorous or arsenic. In some embodiments, the buried doped layer 116 has a doping concentration ranging from about $1 \times 10^{15}$ atoms/cm$^3$ to about $1 \times 10^{17}$ atoms/cm$^3$. If the doping concentration of the buried doped layer 116 is too high, the breakdown voltage resulting from reverse bias is reduced, in some instances. If the doping concentration of the buried doped layer 116 is too low, the forward current resulting from forward bias is reduced, in some instances.

A multiplication junction region 117 where the carrier multiplication occurs is formed at an interface between the first deep well 112 and the buried doped layer 116. During operation, the SPAD 110 is reverse biased above a breakdown voltage, and incident photons strike the SPAD 110 from the front side 104 of the semiconductor substrate 102 to generate carriers. The photon-generated carriers move to the multiplication junction region 117 and trigger an avalanche current that amplifies the signals generated by the incident photon(s). The avalanche current/amplified signal is subsequently detected by peripheral circuits.

In some embodiments, the SPAD 110 further includes a second deep well 118 of the second conductivity type and a second heavily doped region 120 of the second conductivity type in a top region of the second deep well 118. In some embodiments, the second deep well 118 and the second heavily doped region 120 are doped with n-type dopants. In some embodiments, the second deep well 118 has a doping concentration ranging from about $1\times10^{16}$ atoms/cm$^3$ to about $1\times10^{18}$ atoms/cm$^3$. If the doping concentration of the second deep well 118 is too high, the breakdown voltage resulting from reverse bias is reduced, in some instances. If the doping concentration of the second deep well 118 is too low, the forward current resulting from forward bias is reduced, in some instances. The second deep well 118 extends from the front surface of semiconductor substrate 102 into semiconductor substrate 102, and contacts a peripheral portion of the buried doped layer 116. The second deep well 118 is laterally spaced apart from the first deep well 112. In some embodiments, the second heavily doped region 120 is disposed within the top region of the second deep well 118 and arranged along the front surface of the semiconductor substrate 102. The second heavily doped region 120 serves as a contact region for SPAD 110.

In order to provide an adequate Ohmic contact with the interconnect structure 130, the second heavily doped region 120 is doped to have a greater doping concentration than the second deep well 118. In some embodiments, the doping concentration of second heavily doped region 120 is about 50 times to about 200 times greater than a doping concentration of the second deep well 118. In some embodiments, the second heavily doped region 120 has a doping concentration ranging from about $5\times10^{18}$ atoms/cm$^3$ to about $1\times10^{21}$ atoms/cm$^3$. If the doping concentration of the second heavily doped region 120 is too low, a contact resistance is high between the second heavily doped region 120 and the interconnect structure 130, in some instances. If the doping concentration of the second heavily doped region 120 is too high, the effect of Ohmic contact between the second heavily doped region 120 and the interconnect structure 130 does not change but cost increases, in some instances. A portion 124 of the semiconductor substrate 102 located between the first deep well 112 and the second deep well 118 functions as a guard ring to prevent edge breakdown of the SPAD 110.

In some embodiments, the SPAD 110 further includes a third heavily doped region 122 surrounding and spaced from the second heavily doped region 120. The third heavily doped region 122 has a conductivity type the same as the first heavily doped region 114. In some embodiments, the third heavily doped region 122 includes p-type dopants. The third heavily doped region 122 serves as another contact region for SPAD 110. In order to provide an adequate Ohmic contact with the interconnect structure 130, in some embodiments, the third heavily doped region 122 is doped to have a doping concentration ranging from about $1\times10^{19}$ atoms/cm$^3$ to about $1\times10^{21}$ atoms/cm$^3$. If the doping concentration of the third heavily doped region 122 is too low, a contact resistance is high between the third heavily doped region 122 and the interconnect structure 130, in some instances. If the doping concentration of the third heavily doped region 122 is too high, the effect of Ohmic contact between the third heavily doped region 122 and the interconnect structure 130 does not change but cost increases, in some instances. The heavily doped regions 114, 120, 122 thus are provided as low resistance contact regions for SPAD 110.

As one of ordinary skill in the art would recognize, the SPAD device structure described above is merely one type of SPAD device structure usable in embodiments of this disclosure. Any suitable SPAD device structure is usable, and included within the scope of the embodiments of this disclosure.

The substrate 102 includes a plurality of isolation structures 108 to electrically isolate the second heavily doped region 120 and the third heavily doped region 122. The isolation structures 108 also electrically isolate SPADs 110 from other circuits of the image sensor 100 at the periphery of the semiconductor substrate 102, such as an active quench circuit for stopping avalanche effect and resetting bias of SPAD and a read-out circuit for processing signal delivered by SPAD (not shown). In some embodiments, the isolation structures 108 are shallow trench isolation (STI) structures extending from the front surface of the semiconductor substrate 102 to below the level of the second and third heavily doped regions 120, 122. In some embodiments, the isolation structures 108 include a dielectric material such as silicon oxide, silicon nitride or silicon oxynitride.

The interconnect structure 130 includes contact plugs 142, 144, 146 within a stack of dielectric layers, including a resist protective layer 132, a contact etch stop layer (CESL) 134 and an inter-layer dielectric (ILD) layer 136. The contact plugs connect the SPAD 110 to overlying metallization layers 152. The contact plugs include a first contact plug 142 contacting the first heavily doped region 114, a second contact plug 144 contacting the second heavily doped region 120 and a third contact plug 146 contacting the third heavily doped region 122. Each contact plug 142, 144, 146 forms an Ohmic contact with a corresponding heavily doped region 114, 120, 122. In some embodiments, the contact plugs 142, 144, 146 include a conductive material such as, for example, copper, tungsten, aluminum, or alloys thereof. In some embodiments, the contact plugs 142, 144, 146 also include a barrier/adhesion liner (not shown) to prevent diffusion and provide better adhesion for contact plugs 142, 144, 146. In some embodiments, the barrier/adhesion liner includes titanium nitride (TiN).

The resist protective layer 132 is deposited on the semiconductor substrate 102. The resist protective layer 132 is configured to protect underlying layers from a silicidation process employed in formation of silicides for peripheral circuits. In some embodiments, the resist protective layer 132 includes a dielectric oxide such as silicon dioxide. In some embodiments, the resist protective layer 132 has a thickness ranging from about 5 nanometer (nm) to about 50 nm. If the thickness of the resist protective layer 132 is too small, the effect of preventing silicidation is not achieved, in some instances. If the thickness of the resist protective layer 132 is too great, the effect of preventing silicidation does not change but the cost rises, in some instances.

The CESL 134 is deposited on the resist protective layer 132 for controlling an end point during etch processes for formation of contact plugs 142, 144, 146. In some embodiments, the CESL 134 includes a dielectric nitride such as silicon nitride or silicon oxynitride. In some embodiments, the CESL 134 has a thickness ranging from about 10 nm to about 50 nm. If the thickness of the CESL 134 is too small, the effect of end point control is not achieved, in some instances. If the thickness of the CESL 134 is too great, the effect of end point control does not change but the cost rises, in some instances.

The ILD layer 136 is deposited on the CESL 134. In some embodiments, the ILD layer 136 includes a material having a low dielectric constant (low-k), such as a dielectric constant less than about 3.9. In some embodiments, the k value of ILD layer 136 is lower than about 3.0, or lower than about 2.5. In some embodiments, the ILD layer 136 includes spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, and/or other suitable materials. In some embodiments, the ILD layer 136 has a thickness ranging from about 50 nm to 200 nm. If the thickness of the ILD 136 is too small, the effect of protecting contact plugs 142, 144, 146 is not achieved, in some instances. If the thickness of the ILD layer 136 is too great, the effect of protecting contact plugs 142, 144, 146 does not change but the cost rises, in some instances.

The interconnect structure 130 further includes a plurality of metallization layers 152 disposed within an inter-metal dielectric (IMD) layer 150 present over the ILD layer 136. The metallization layers 152 are formed outside of an active region of the SPAD 110 (i.e., a region of the SPAD 110 subjected to illumination). That is, the metallization layer 152 are located over regions of substrate 102 not above the active region of the SPAD 100. The metallization layers 152 electrically couple the SPAD 110 to the peripheral circuits (not shown). The metallization layers 152 include metal lines, metal vias (not shown) and/or a combination of metal lines and metal vias (not shown) vertically abutting the metal lines. In some embodiments, the metal lines and metal vias include a conductive material such as copper, tungsten, aluminum, or alloys thereof. In some embodiments, metal lines and metal vias include copper or copper alloys.

The IMD layer 150 is deposited on the ILD layer 136. In some embodiments, the IMD layer 150 includes a low-k dielectric material the same as or different from that of the ILD layer 136. For example, the IMD layer 150 includes spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), or polyimide. In some embodiments, the IMD layer 150 has a multi-layer structure including a plurality of dielectric layers, each formed of a low-k dielectric material with one metallization layer 152 disposed therein.

Additionally, the interconnect structure 130 includes a passivation layer 160 containing metal pads 162 atop the IMD layer 150. The passivation layer 160 protects the underlying layers from physical and chemical damage. In some embodiments, the passivation layer 160 includes silicon dioxide, silicon oxynitride, silicon nitride, or silicon oxycarbide. In some embodiments, the passivation layer 160 has a multi-layer structure including more than one layer, each formed of a dielectric material. In some embodiments, the passivation layer 160 has a thickness ranging from about 50 nm to about 100 nm. If the thickness of the passivation layer 160 is too small, the effect of protecting underlying layers is not achieved, in some instances. If the thickness of the passivation layer 160 is too great, the effect of protecting underlying layers does not change but the cost rises, in some instances.

The metal pads 162 are located over regions of substrate 102 not above the active region of SPAD 110 and are in contact with a topmost metallization layer 152. The metal pads 162 also provide bonding sites for external connections. In some embodiments, the metal pads 162 include aluminum or an aluminum-copper alloy.

The image sensor 100 further includes an opening 170. The opening 170 extends through the passivation layer 160, the IMD layer 150 and the ILD layer 136, thereby exposing a portion of the CESL 134 located above the active region of SPAD 110. Thus, the SPAD 110 is operated by illuminating the active region of the SPAD 110 through the opening 170. In some embodiments, the opening 170 has substantially vertical sidewalls. In some embodiments, the opening 170 has tapered sidewalls to facilitate light reflection. In some embodiments, sidewalls of opening 170 each has a taper angle from about 80-degrees to 90-degrees.

A cap layer 172 is disposed along at least sidewalls of the opening 170. The cap layer 172 also extends along the top surface of the passivation layer 160 and exposes metal pads 162. In some embodiments, the top surface of the passivation layer 160 is free of cap layer 172 material. The cap layer 172 includes a dielectric material that has a higher moisture resistance than the low-k dielectric material that provides the IMD layer 150 or the ILD layer 136, thus is usable as a moisture barrier. In some embodiments, the cap layer 172 absorbs less moisture than the IMD layer 150 and/or ILD layer 136. In some embodiments, the cap layer 172 includes silicon nitride or silicon oxynitride. The material, thickness, and/or sidewall angles of cap layer 172 are also configured to facilitate reflection of the incident light to the active region of SPAD 110, thus increasing photon detection probability of SPAD 110. The thickness of the cap layer 172 is configured to sufficiently prevent moisture penetration. In some embodiments, the cap layer 172 has a thickness ranging from about 10 nm to about 100 nm. If the thickness of the cap layer 172 is too small, the cap layer 172 cannot sufficiently prevent the moisture absorption, in some instances. If the thickness of dielectric is too great, the effect of preventing moisture absorption does not change but the cost rises, in some instances.

Because the cap layer 172 includes a dielectric material having a higher moisture resistance than dielectric materials employed in the interconnect structure 130, the moisture intake by the dielectrics in the interconnect structure 130 (e.g., ILD layer 136 and/or IMD layer 150) is reduced. As a result, the reliability of the image sensor 100 is improved. Moreover, the cap layer 172 also reflects the incident light back towards the active region of SPAD 110, thus increasing the probability of incident photons being detected by SPAD 110. Introducing the cap layer 172 on the sidewalls of the interconnect structure 130 also leads to an increase in photon detection probability.

Figure 2:
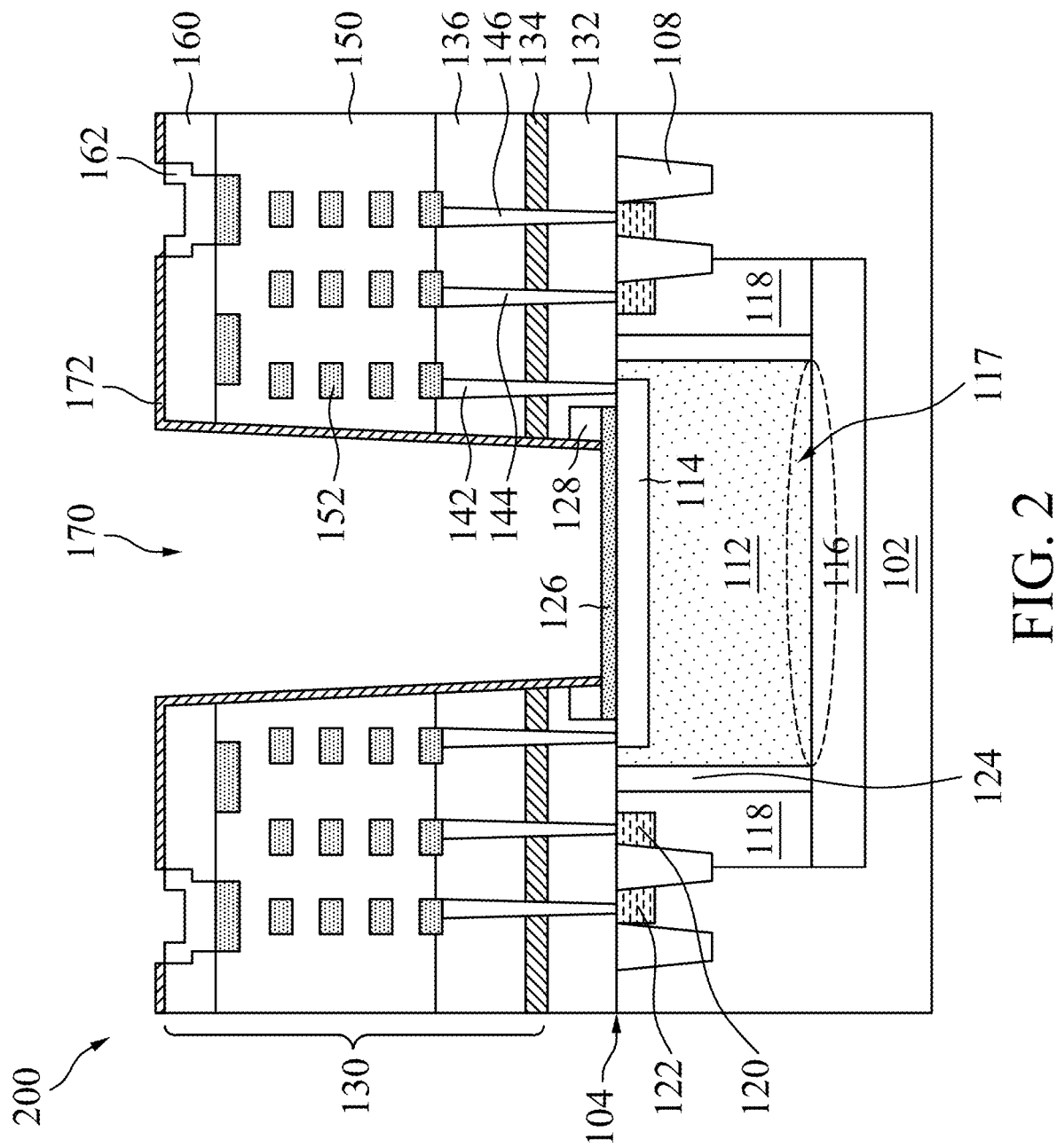
FIG. 2 is a cross-sectional view of a SPAD image sensor, in accordance with some embodiments.

FIG. 2 is a cross-sectional view of an image sensor 200, in accordance with some embodiments. Components of image sensor 200 that are the same or similar to those in image sensor 100 are given the same reference numbers, and detailed description thereof is thus omitted.

In comparison with image sensor 100 in FIG. 1, image sensor 200 includes a gate stack disposed between the SPAD 110 and the interconnect structure 130. The gate stack includes a gate dielectric 126 and a gate electrode 128 on the gate dielectric 126. The gate stack (126, 128) is a dummy gate (i.e., electrically non-functional gate) formed in the same process stage that forms gates for peripheral circuits. In image sensor 200, the opening 170 extends through an entirety of dielectric layers in interconnect structure 130, including passivation layer 160, IMD layer 150, ILD layer 136, CESL 134 and resist protective layer 132, as well as the gate electrode 128. The opening 170 thus exposes a portion of the gate dielectric 126 located above the active region of the SPAD 110. Compared with image sensor 100, removing portions of the CESL 134 and resist protective layer 132 from the active region of SPAD 110 further reduces the thickness of light absorption/blocking dielectrics located above the active region of SPAD 110, so that more light reaches the SPAD 110. As a result, the performance of the image sensor is further enhanced.

In some embodiments, the gate dielectric 126 includes a high-k dielectric material. The high-k dielectric material such as hafnium oxide, hafnium silicate, zirconium silicate, or zirconium dioxide has a dielectric constant higher than silicon dioxide. In some embodiments, the gate dielectric 126 includes hafnium oxide with a thickness ranging from about 1 nm to 10 nm. If the thickness of the gate dielectric 126 is too small, there is a danger of etching through the gate dielectric, shorting the logic devices, in some instances. If the thickness of the gate dielectric 126 is too great, the speed of logic devices is lowered, in some instances. In some embodiments, the gate dielectric 126 also includes an interfacial layer (not shown) to reduce damage between the gate dielectric 126 and the semiconductor substrate 102. The interfacial layer includes, for example, silicon dioxide. In some embodiments, the gate electrode 128 includes polysilicon or doped polysilicon with uniform or gradient doping.

Figure 3:
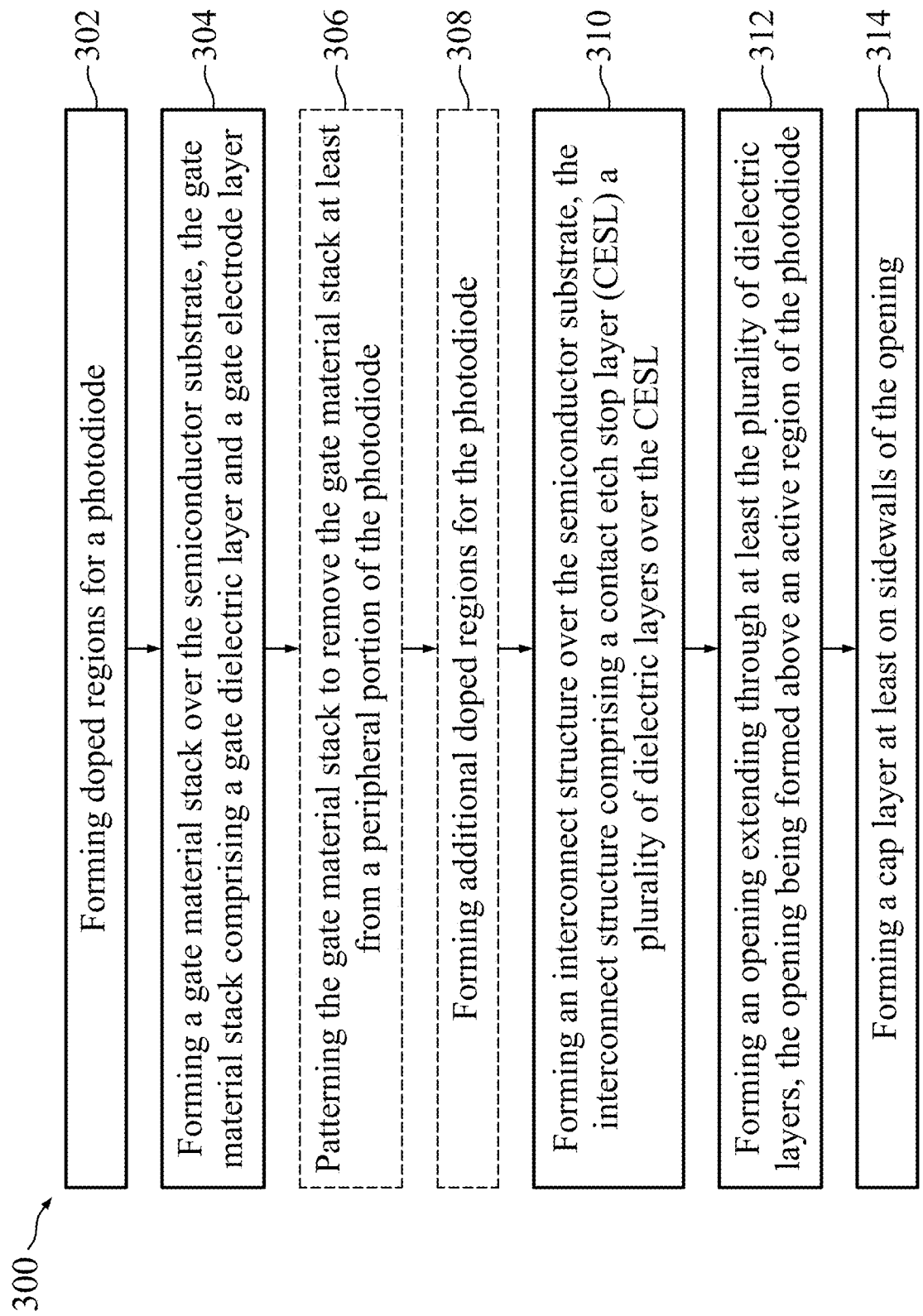
FIG. 3 is a flowchart of a method of fabricating a SPAD image sensor, in accordance with some embodiments.

FIG. 3 is a flowchart of a method 300 for fabricating an image sensor using a CMOS process, in accordance with some embodiments. One of ordinary skill in the art would understand that, in some embodiments, additional steps are performed before, during, and after the method 300 and that some of the steps described are replaced or eliminated in some embodiments of the method 300. FIGS. 4-10B are cross-sectional views of an image sensor at various stages of fabrication undergoing the method 300, in accordance with some embodiments. With reference to FIG. 3 and FIGS. 4-10B, the method 300 and the image sensor fabricated thereby are collectively described below.

Figure 4:
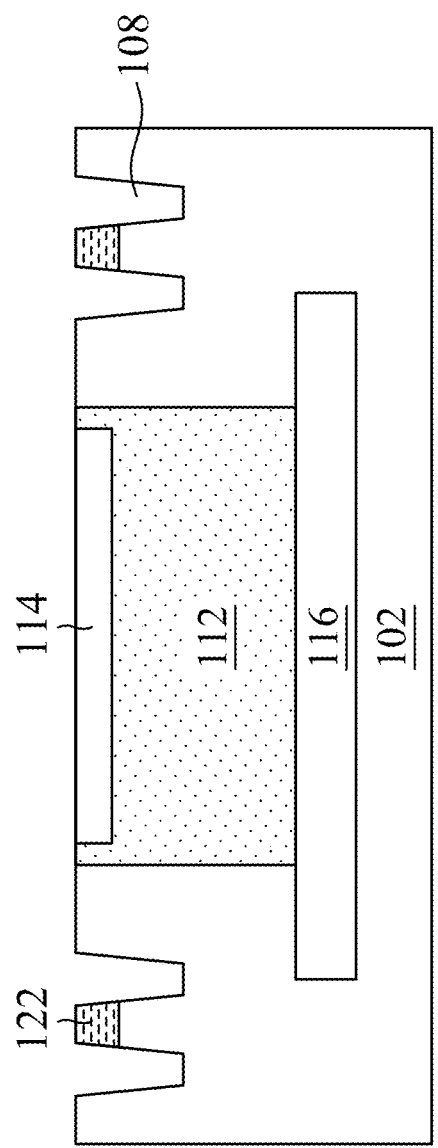
FIG. 4 is a cross-sectional view of a semiconductor structure including doped regions in a semiconductor substrate, in accordance with some embodiments.

Referring to FIGS. 3 and 4, the method 300 includes operation 302 in which doped regions, such as a first deep well 112, a first heavily doped region 114, a buried doped layer 116 and a third heavily doped region 122, are formed within a semiconductor substrate 102. In some embodiments, a series of implantation processes and/or doped epitaxial processes are performed to introduce dopants, either p-type or n-type, into the semiconductor substrate 102 through a front surface of the semiconductor substrate 102, thereby forming the first deep well 112, the first heavily doped region 114 and the buried doped layer 116. When doped epitaxial processes are used, in some embodiments, the dopants are added during the epitaxial processes, while in some embodiments, the dopants are implanted following the epitaxial processes. After the doping processes are performed, a rapid thermal annealing (RTA) process is used to activate the dopants in the doped regions 112, 114, 116, 122 to provide the desired conductive properties, in some embodiments.

In some embodiments, isolation structures 108 are formed by etching trenches (not shown) in the semiconductor substrate 102 using a photolithography process, and filling the trenches with one or more dielectric materials. In some embodiments, the trenches are formed by applying a photoresist layer (not shown) over the semiconductor substrate 102, lithographically patterning the photoresist layer, and transferring the pattern into the upper portion of the semiconductor substrate 102 by an anisotropic etch such as reactive ion etch (RIE) or plasma etch. The dielectric material is deposited by chemical vapor deposition (CVD) or physical vapor deposition (PVD). Excess dielectric material is then removed from above the front surface of the semiconductor substrate 102, for example, by chemical mechanical planarization (CMP). After planarization, the top surfaces of the isolation structures 108 are coplanar with the front surface of the semiconductor substrate 102. In some embodiments, the isolation structures 108 are field oxides formed by a thermal oxidation process.

Figure 5:
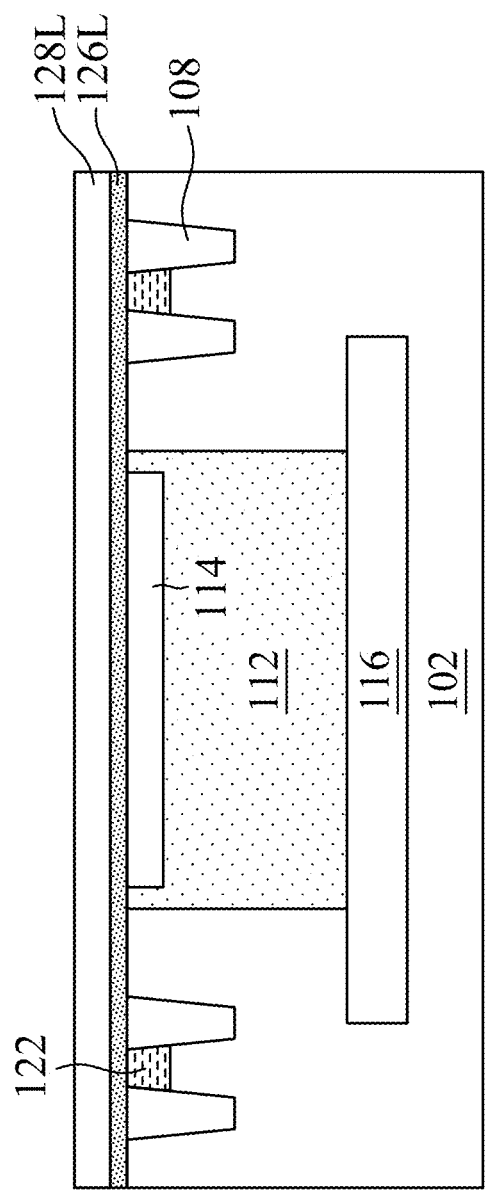
FIG. 5 is a cross-sectional view of the semiconductor structure of FIG. 4 after depositing a gate material stack on the semiconductor substrate, in accordance with some embodiments.

Referring to FIGS. 3 and 5, in operation 304 a gate material stack is deposited on the semiconductor substrate 102. In some embodiments, the gate material stack is deposited in both diode region and peripheral circuit region such that the entire semiconductor substrate 102 is covered by the gate material stack. In some embodiments, the gate material stack is deposited only in the peripheral circuit region such that the diode region is free of any gate materials (not shown). In some embodiments, the gate material stack includes a gate dielectric layer 126L and a gate electrode layer 128L. In some embodiments, the gate dielectric layer 126L is formed using a suitable deposition process such as atomic layer deposition (ALD), CVD, PVD, or plasma-enhanced chemical deposition (PECVD). In some embodiments, the gate electrode layer 128L is formed using a low-pressure chemical vapor deposition (LPCVD) process. In at least one embodiment, the LPCVD process is carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

Figure 6A:
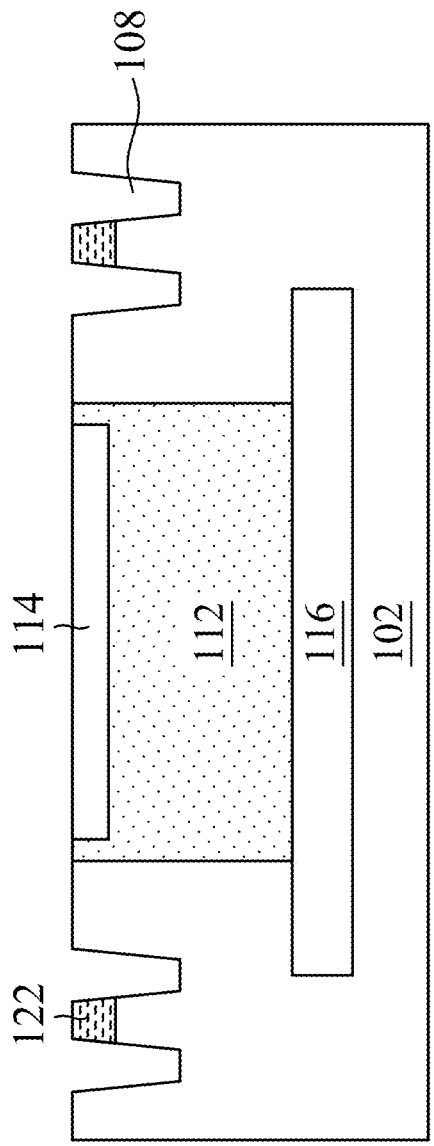
FIG. 6A is a cross-sectional view of the semiconductor structure of FIG. 5 after removing the gate material stack completely from the diode region, in accordance with some embodiments.
Figure 6B:
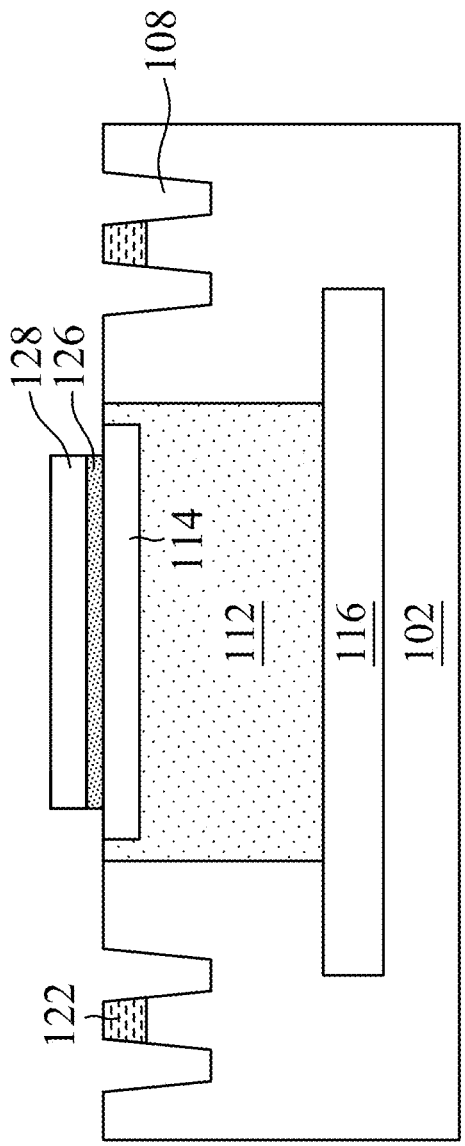
FIG. 6B is a cross-sectional view of the semiconductor structure of FIG. 5 after partially removing the gate material stack from the diode region, in accordance with some embodiments.

Referring to FIGS. 3 and 6A-6B, in operation 306 various patterning techniques are performed to pattern the gate material stack, i.e., the gate electrode layer 128L and the gate dielectric 126L. In some embodiments, a photoresist layer (not shown) is formed over the gate electrode layer 128L by a suitable process, such as spin-on coating, and patterned to form a patterned photoresist feature over the gate electrode layer 128L. The patterned photoresist feature is then transferred into the gate electrode layer 128L and the gate dielectric layer 126L using a single or multiple etching processes. In some embodiments, the etching processes are dry etch such as RIE or plasma etch. In some embodiments and as shown in FIG. 6A, a portion of the gate material stack (126L, 128L) in the diode region is completely removed such that an active region of the SPAD 110 is exposed. In some embodiments and as shown in FIG. 6B, a portion of the gate material stack (126L, 128L) in the diode region is partially removed such that the active region of the SPAD 110 remains covered by a gate stack. The gate stack includes a gate dielectric 126 which is a remaining portion of the gate dielectric layer 126L in the diode region and a gate electrode 128 which is a remaining portion of the gate electrode layer 128L in the diode region. The gate stack (126, 128) is a dummy (i.e., electrically non-functional) gate. In instances where the diode region does not contain the gate material stack (126L, 128L), the steps that completely remove the gate material stack (126L, 128L) from the active region of the SPAD 110 are omitted.

Figure 7A:
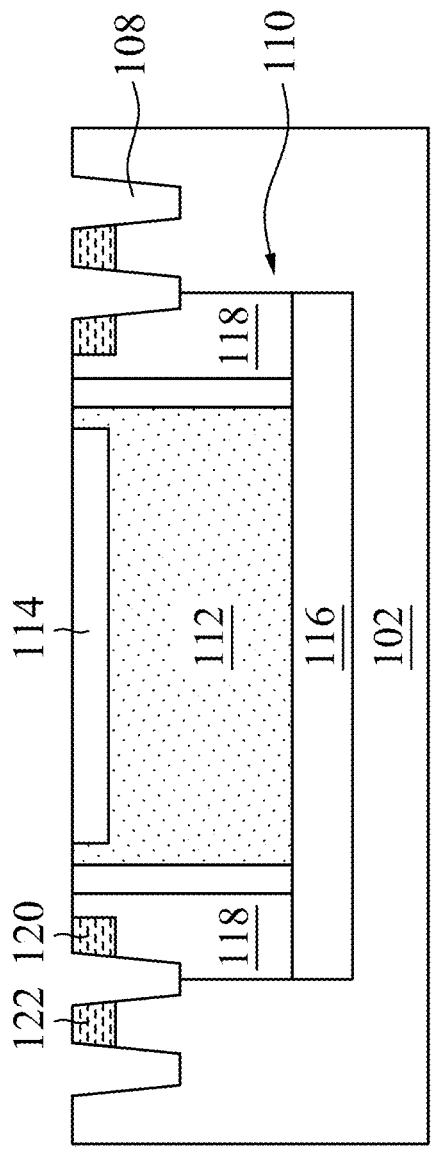
FIGS. 7A and 7B are cross-sectional views of the semiconductor structures of FIGS. 6A and 6B, respectively, after forming additional doped regions in the semiconductor substrate, in accordance with some embodiments.
Figure 7B:
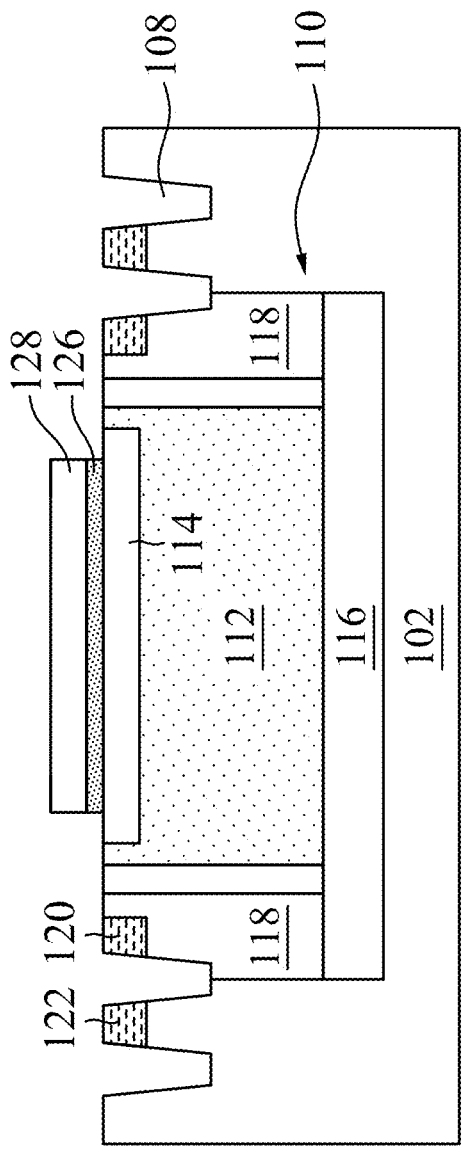

Referring to FIGS. 3 and 7A-7B, in operation 308 additional doped regions, such as a second deep well 118 and a second heavily doped region 120 are formed within the semiconductor substrate 102 by various implantation processes or doped epitaxial processes. The implantation processes or doped epitaxial processes also form source/drain regions for CMOS transistors in peripheral circuits (not shown). A SPAD 110 is thus formed within the semiconductor substrate 102. After the doping processes are performed, a rapid thermal annealing (RTA) process is used to activate the dopants in the additional doped regions 118, 120 to provide the desired conductive properties, in some embodiments. It should be noted that the second deep well 118 and the second heavily doped region 120 can also be formed before formation of the gate material stack (126L, 128L) and be formed in operation 302 when doped regions 112, 114, 116, 122 is formed. In instances where the additional doped regions (e.g. second deep well 118 and second heavily doped region 120) are formed in the same process stage that forms doped regions 112, 114, 116, 122, operation 308 is omitted.

Figure 8A:
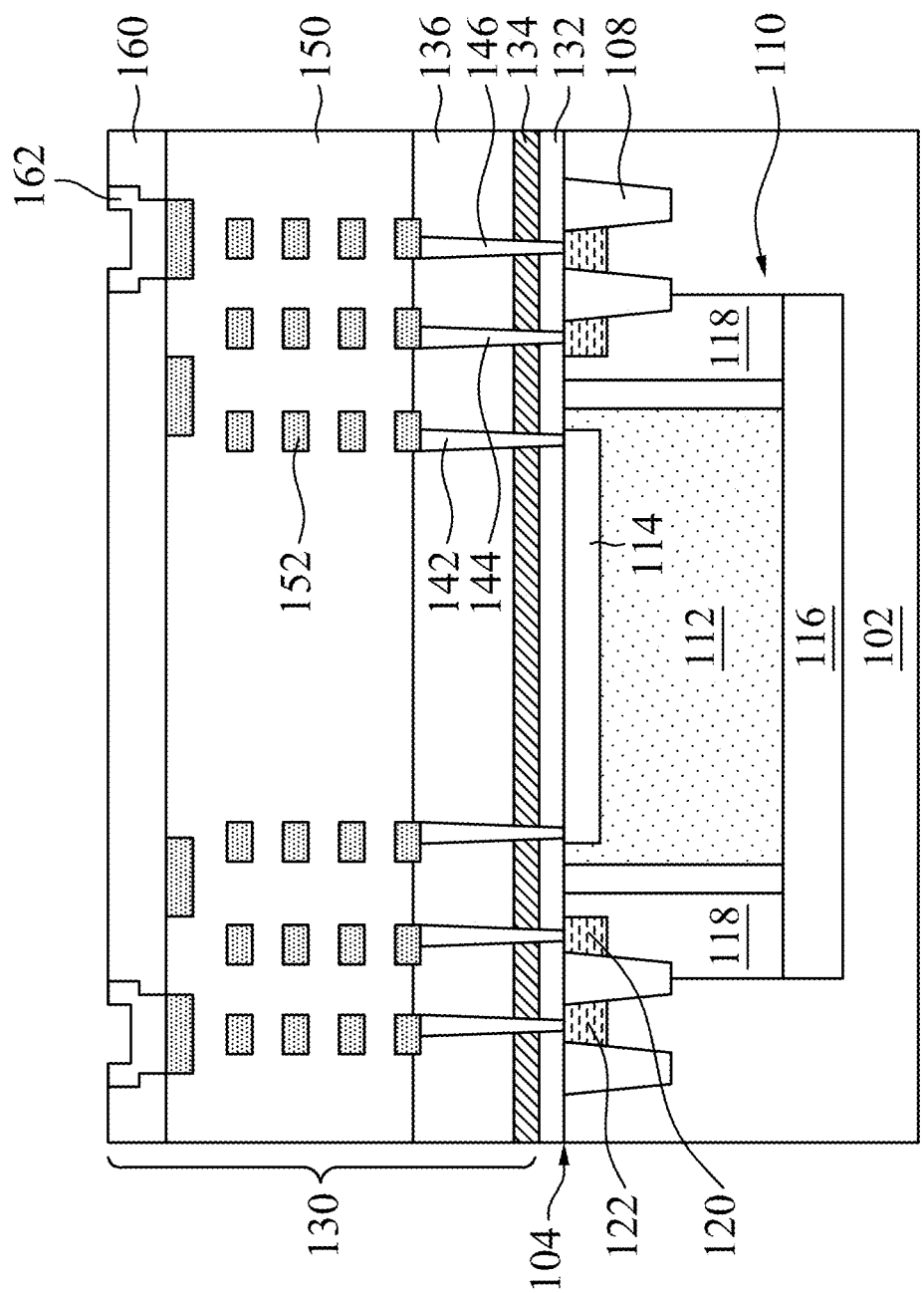
FIGS. 8A and 8B are cross-sectional views of the semiconductor structures of FIGS. 7A and 7B, respectively, after disposing an interconnect structure over the semiconductor substrate, in accordance with some embodiments.
Figure 8B:
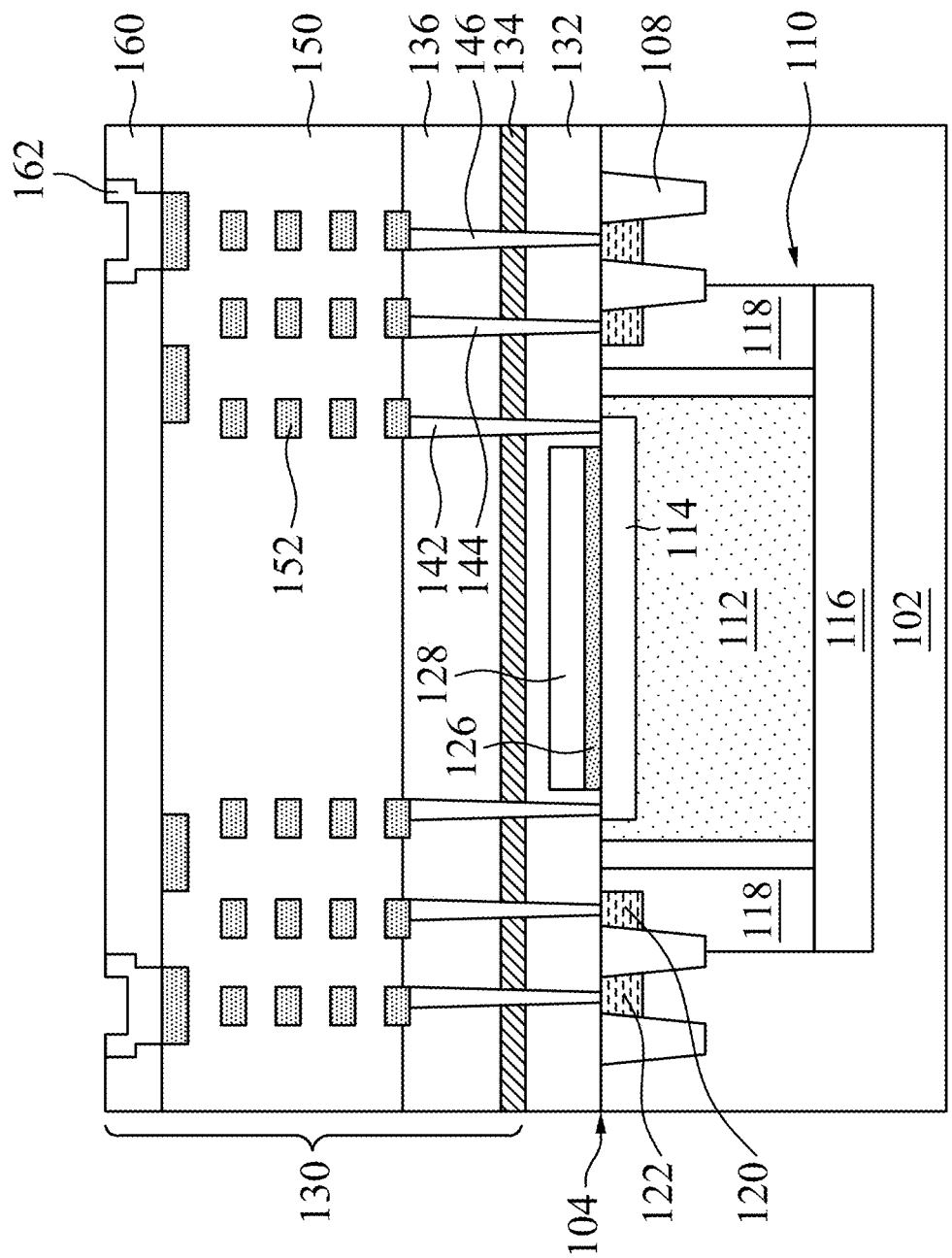

Referring to FIGS. 3 and 8A-8B, in operation 310 an interconnect structure 130 is formed over a front side 104 of the semiconductor substrate 102. First, a resist protective layer 132, a CESL 134 and an ILD layer 136 are sequentially deposited over the semiconductor substrate 102 utilizing suitable deposition processes. In some embodiments, the resist protective layer 132, the CESL 134 and the ILD layer 136 are deposited using, for example, CVD, PVD, PECVD or spin-on coating. As shown, in instances where the gate material stack (126L, 128L) is completely removed from the surface of the SPAD 110, the resist protective layer 132 is in direct contact with the SPAD 110 (FIG. 8A), while in instances where the gate stack (126, 128) remains on the active region of the SPAD 110, the resist protective layer 132 contacts the gate stack (126, 128) as well as portions of the SPAD 110 not covered by the gate stack (126, 128) (FIG. 8B). In some embodiments, after the ILD layer 136 deposition, a CMP process is performed to planarize the ILD layer 136.

Next, the ILD layer 136, the CESL 134 and the resist protective layer 132 are etched to form contact openings, and the contact openings are subsequently filled with a conductive material to provide the contact plugs 142, 144, 146. In some embodiments, the contact openings are filled using a deposition process (e.g., CVD or PVD) or a plating process (e.g., electroplating or electro-less plating). Subsequently, a CMP process is performed to remove excess of the conductive material from a top surface of the ILD layer 136.

Next, metallization layers 152 are formed electrically connected to the contact plugs 142, 144, 146. In some embodiments, an IMD layer 150 is deposited over the ILD layer 136 by, for example, CVD or spin-on coating. The IMD layer 150 is subsequently etched to form via holes and/or line trenches. The via holes and/or line trenches are then filled with a conductive material to provide the metallization layers 152.

Next, metal pads 162 are formed atop the IMD layer 150 electrically connected to the metallization layers 152. In some embodiments, the meal pads 162 are formed by depositing a metal layer on the IMD layer 150 and then selectively etching the metal layer. A passivation layer 160 is subsequently deposited on the IMD layer 150, laterally surrounding the metal pads 162. In alternative embodiments, the metal pads 162 are formed by depositing a passivation layer on the IMD layer 150, etching the passivation layer to define pad openings in the passivation layer 160, depositing a conductive material lining the pad openings, and removing excess conductive material from a top surface of the passivation layer 160.

Figure 9A:
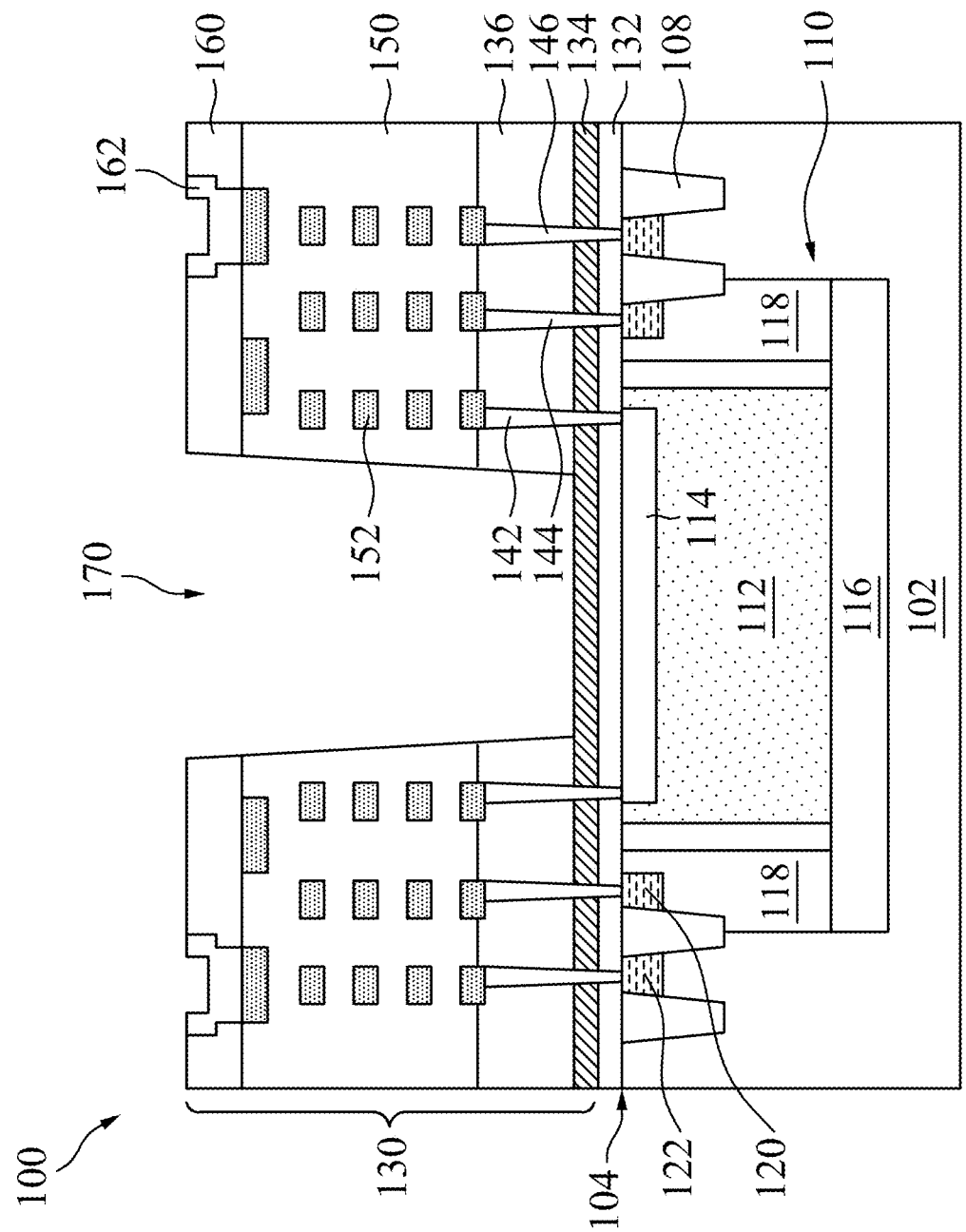
FIGS. 9A and 9B are cross-sectional views of the semiconductor structures of FIGS. 8A and 8B, respectively, after etching at least dielectric layers in the interconnect structure to define an opening above an active region of the SPAD, in accordance with some embodiments.
Figure 9B:
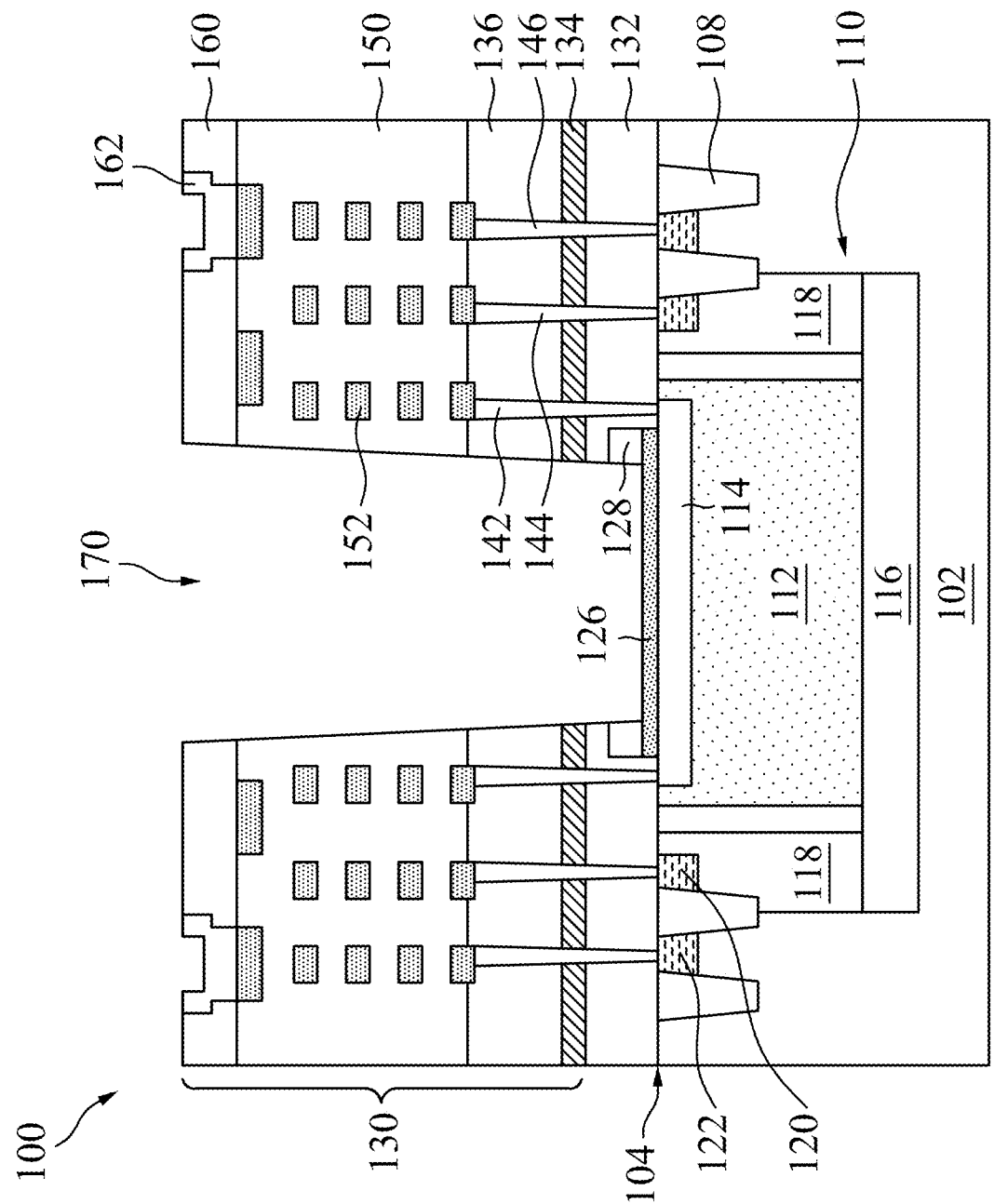

Referring to FIGS. 3 and 9A-9B, in operation 312 an opening 170 is formed in front of the active region of SPAD 110. In one embodiment and as shown in FIG. 9A, the opening 170 extends through the passivation layer 160, the IMD layer 150 and ILD layer 136, exposing a portion of the CESL 134 above the active region of the SPAD 110. In another embodiment and as shown in FIG. 9B, in instance where the active region of SPAD 110 is covered by the gate stack (126, 128), the opening 170 extends through the passivation layer 160, the IMD layer 150, the ILD layer 136, the CESL 134, the resist protective layer 132 and the gate electrode 128, exposing a portion of the gate dielectric 126 above the active region of the SPAD 110. In either case, the opening 170 also exposes sidewalls of the IMD layer 150 and the ILD layer 136. In some embodiments, the layers of materials are etched to define the opening 170 therein using multiple etching processes. In some embodiments, the etch is a dry etch such as, for example, RIE, a wet chemical etch or a combination thereof.

Figure 10A:
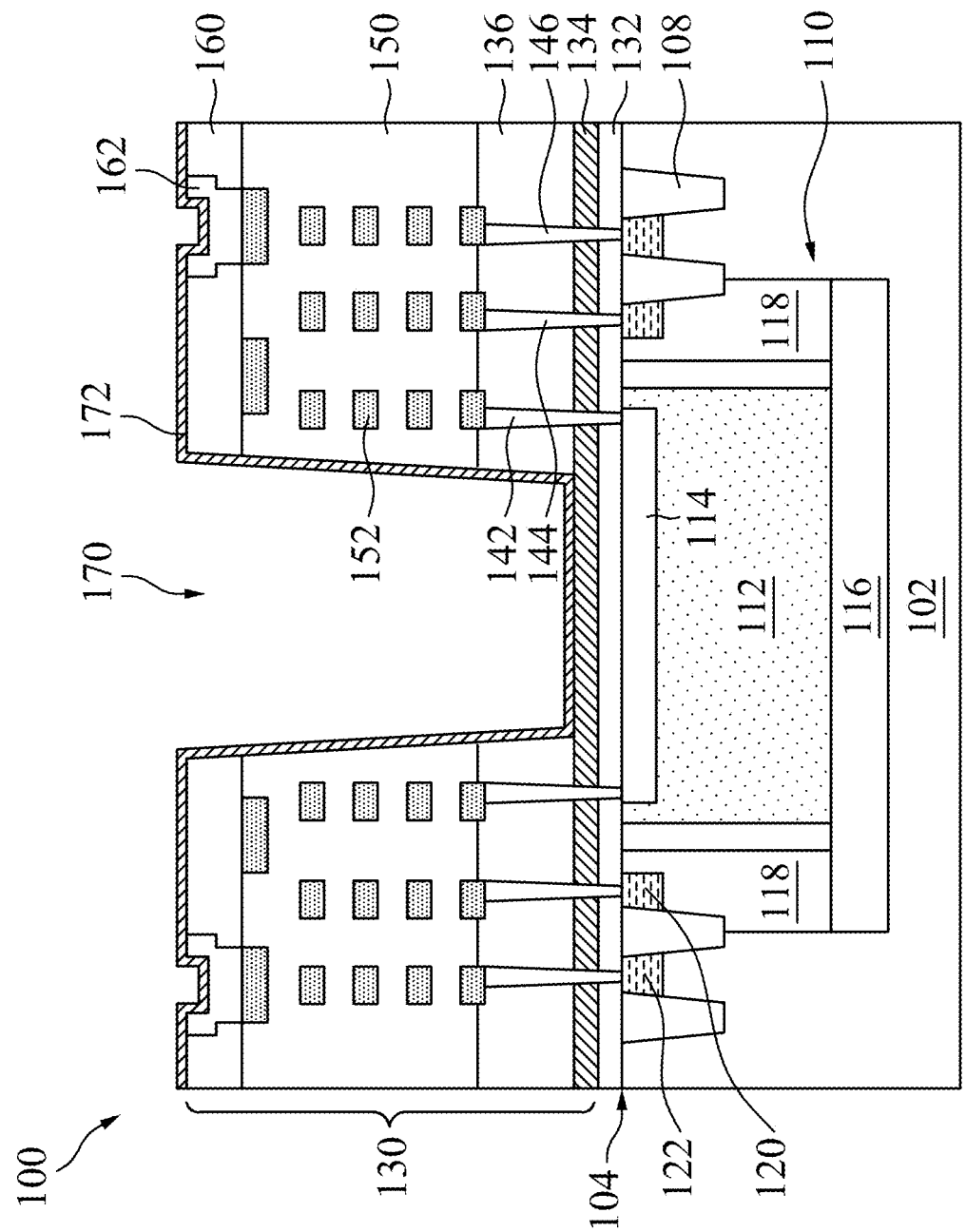
FIGS. 10A and 10B are cross-sectional views of the semiconductor structures of FIGS. 9A and 9B, respectively, after depositing a cap layer along surfaces of the opening and over the interconnect structure, in accordance with some embodiments.
Figure 10B:
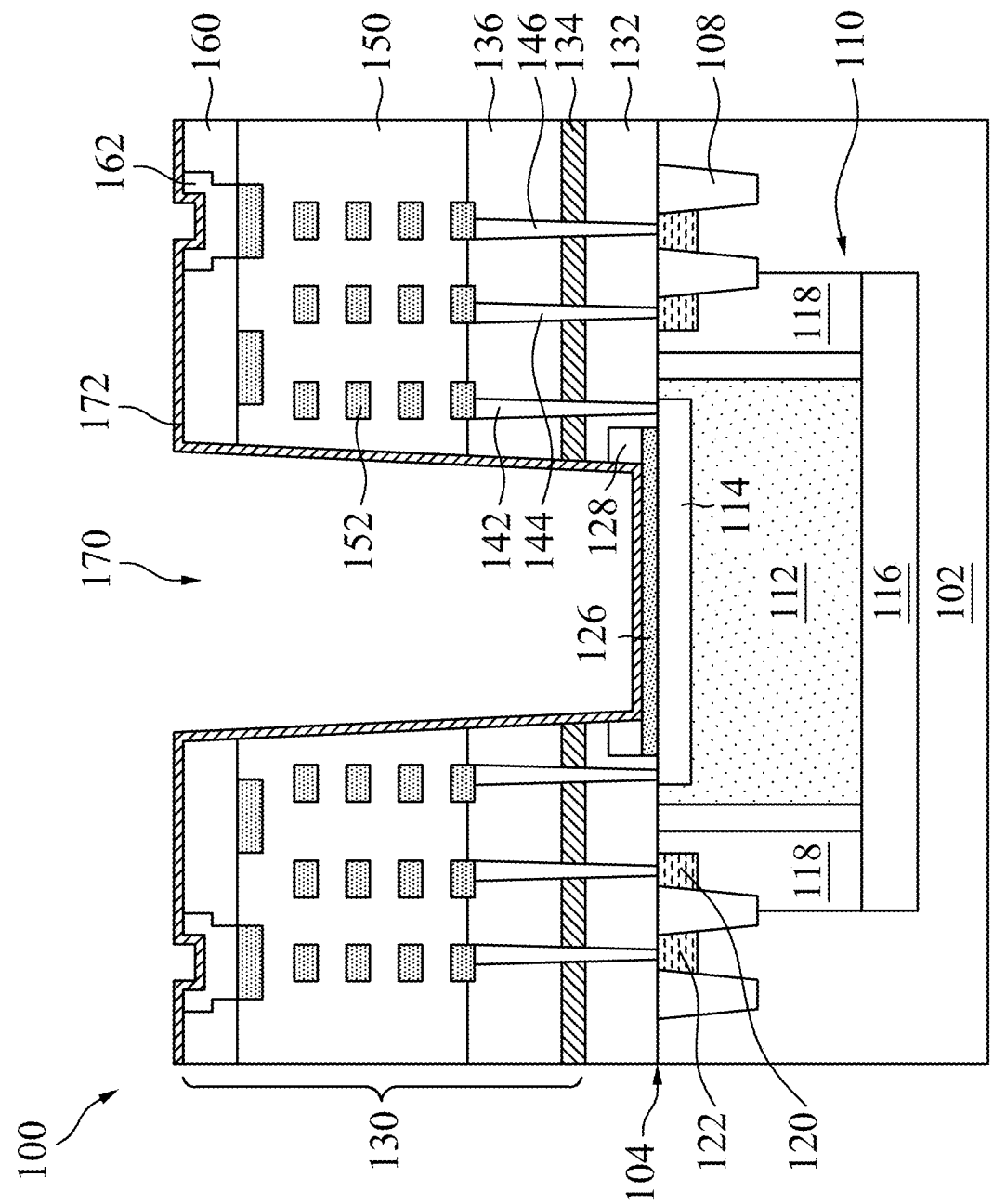

Referring to FIGS. 3 and 10A-10B, in operation 314, a cap layer 172 is deposited on sidewalls and a bottom of the opening 170 and on exposed surfaces of the passivation layer 160 and the metal pads 162. In some embodiments, the cap layer 172 is deposited by a conformal deposition process such as CVD or ALD. Subsequently, the cap layer 172 is etched to remove the cap layer 172 at least from the bottom of the opening 170 and from the metal pads 162. In some embodiments, the cap layer 172 is also removed from the top surface of the passivation layer such that the cap layer 172 only remains on the sidewalls of the interconnect structure 130 that are exposed by the opening 170. In some embodiments, the selective etching of the cap layer 172 is performed using a dry etch such as RIE. The partial removal of the cap layer 172 re-exposes the CESL 134 at the bottom of the opening 170 (as shown in FIG. 1) or the gate dielectric 126 at the bottom of the opening 170 (as shown in FIG. 2).

One aspect of this description relates to an image sensor. The image sensor includes a photodiode within a semiconductor substrate and an interconnect structure over the semiconductor substrate. The interconnect structure includes a CESL, a plurality of dielectric layers over the CESL and a plurality of metallization layers in the plurality of dielectric layers. At least one dielectric layer of the plurality of dielectric layers includes a low-k dielectric material. An opening is extended through the plurality of dielectric layers to expose a portion of the CESL above an active region of the photodiode. A cap layer is on sidewalls of the opening. The cap layer include a dielectric material having a higher moisture resistance than the low-k dielectric material. In some embodiments, the cap layer includes silicon nitride or silicon oxynitride. In some embodiments, the interconnect structure further includes a resist protective layer between the photodiode and the CESL. In some embodiments, the resist protective layer includes silicon dioxide. In some embodiments, the interconnect structure further includes a passivation layer over a topmost dielectric layer of the plurality of dielectric layers and a plurality of metal pads in the passivation layer. The opening extends though the passivation layer. In some embodiments, the passivation layer includes silicon nitride or silicon oxynitride. In some embodiments, the photodiode includes a first deep well of a first conductivity type extending from a surface of the semiconductor substrate into the semiconductor substrate, a first heavily doped region of the first conductivity type within a top region of the first deep well, a buried doped layer of a second conductivity extending beneath and in contact with the first deep well, the second conductivity type opposite to the first conductivity type, a second deep well of the second conductivity type spaced from the first deep well and contacting a periphery of the buried doped layer, a second heavily doped region of the second conductivity type within a top region the second deep well and a third heavily doped region of the first conductivity type spaced from the second heavily doped region along the surface of the semiconductor substrate. In some embodiments, the interconnect structure further includes a plurality of contact plugs. The plurality of contact plugs includes a first contact plug contacting the first heavily doped region, a second contact plug contacting the second heavily doped region and a third contact plug contacting the third heavily doped region. In some embodiments, the image sensor further includes a plurality of isolation structures in the semiconductor substrate. A first isolation structure of the plurality of isolation structures separates the second heavily doped region from the third heavily doped region.

Another aspect of this description relates to an image sensor. The image sensor includes a photodiode within a semiconductor substrate, a gate stack over the photodiode and an interconnect structure over the semiconductor substrate. The gate stack includes a gate dielectric and a gate electrode over the gate dielectric. The interconnect structure includes a CESL and a plurality of dielectric layers over the CESL. At least one dielectric layer of the plurality of dielectric layers includes a low-k dielectric material. An opening is extended through the plurality of dielectric layers, the CESL and the gate electrode to expose a portion of the gate dielectric above an active region of the photodiode. A cap layer is present at least on sidewalls of the opening. The cap layer includes a dielectric material having a higher moisture resistance than the low-k dielectric material. In some embodiments, the cap layer includes silicon nitride or silicon oxynitride. In some embodiments, the plurality of dielectric layers in the interconnect structure includes an ILD layer over the CESL, and an IMD layer over the ILD layer. In some embodiments, the ILD layer includes a first low-k dielectric material. In some embodiments, the IMD layer includes a second low-k dielectric material that is the same as, or different from, the first low-k dielectric material. In some embodiments, the interconnect structure further includes a plurality of contact plugs in the ILD layer and the CESL. The plurality of contact plugs are electrically coupled to the photodiode. In some embodiments, the interconnect structure further includes a plurality of metallization layers in the IMD layer. The plurality of metallization layer are electrically coupled to the plurality of contact plugs. In some embodiments, the cap layer is on the sidewalls of the opening and a topmost surface of the interconnect structure.

Still another aspect of this description relates to a method of forming an image sensor. The method includes forming a photodiode within a semiconductor substrate, disposing an interconnect structure over the semiconductor substrate. The interconnect structure includes a CESL over the photodiode and a plurality of dielectric layers over the CESL. Next, at least the plurality of dielectric layers is patterned to define an opening above an active region of the photodiode. A cap layer is then deposited on sidewalls of the opening. The at least one dielectric layer of the plurality of dielectric layers includes a low-k material. The cap layer includes a dielectric material having a higher moisture resistance than the low-k dielectric material. In some embodiments, patterning the at least the plurality of dielectric layers includes patterning the plurality of dielectric layers to define the opening in the plurality of dielectric layer. The opening exposes a portion of the CESL above the active region of the photodiode. In some embodiments, the method further includes forming a gate stack of a gate dielectric and a gate electrode over the photodiode. The patterning the at least the plurality of dielectric layers includes patterning the plurality of dielectric layers, the CESL and the gate electrode to define an opening in the plurality of dielectric layers, the CESL and the gate electrode. The opening exposes a portion of the gate dielectric above the active region of the photodiode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   a photodiode within a semiconductor substrate;
   an interconnect structure over the semiconductor substrate, the interconnect structure comprising:
      a contact etch stop layer (CESL),
      a plurality of dielectric layers over the CESL, wherein at least one dielectric layer of the plurality of dielectric layers comprises a low dielectric constant (low-k) dielectric material; and
      a plurality of metallization layers in the plurality of dielectric layers;
   an opening extending through the plurality of dielectric layers, the opening exposing a portion of the CESL above an active region of the photodiode; and
   a cap layer on sidewalls of the opening, wherein the cap layer comprises a dielectric material having a higher moisture resistance than the low-k dielectric material.

2. The image sensor of claim 1, wherein the cap layer comprises silicon nitride or silicon oxynitride.

3. The image sensor of claim 1, wherein the interconnect structure further comprises a resist protective layer between the photodiode and the CESL.

4. The image sensor of claim 3, wherein the resist protective layer comprises silicon dioxide.

5. The image sensor of claim 1, wherein the interconnect structure further comprises:
   a passivation layer over a topmost dielectric layer of the plurality of dielectric layers; and
   a plurality of metal pads in the passivation layer,
   wherein the opening extends though the passivation layer.

6. The image sensor of claim 5, wherein the passivation layer comprises silicon nitride or silicon oxynitride.

7. The image sensor of claim 1, wherein the photodiode comprises:
   a first deep well of a first conductivity type extending from a surface of the semiconductor substrate into the semiconductor substrate;
   a first heavily doped region of the first conductivity type within a top region of the first deep well;
   a buried doped layer of a second conductivity extending beneath and in contact with the first deep well, the second conductivity type opposite to the first conductivity type;
   a second deep well of the second conductivity type spaced from the first deep well and contacting a periphery of the buried doped layer;
   a second heavily doped region of the second conductivity type within a top region of the second deep well; and
   a third heavily doped region of the first conductivity type spaced from the second heavily doped region along the surface of the semiconductor substrate.

8. The image sensor of claim 7, wherein the interconnect structure further comprises a plurality of contact plugs, the plurality of contact plugs comprises:
   a first contact plug contacting the first heavily doped region;
   a second contact plug contacting the second heavily doped region; and
   a third contact plug contacting the third heavily doped region.

9. The image sensor of claim 7, further comprising a plurality of isolation structures in the semiconductor substrate, wherein a first isolation structure of the plurality of isolation structures separates the second heavily doped region from the third heavily doped region.

10. An image sensor comprising:
a photodiode within a semiconductor substrate;
a gate stack over the photodiode, the gate stack comprising a gate dielectric and a gate electrode over the gate dielectric;
an interconnect structure over the semiconductor substrate, the interconnect structure comprising:
a contact etch stop layer (CESL); and
a plurality of dielectric layers over the CESL, wherein at least one dielectric layer of the plurality of dielectric layers comprises a low dielectric constant (low-k) dielectric material;
an opening extending through the plurality of dielectric layers, the CESL and the gate electrode, the opening exposing a portion of the gate dielectric above an active region of the photodiode; and
a cap layer present at least on sidewalls of the opening, wherein the cap layer comprises a dielectric material having a higher moisture resistance than the low-k dielectric material.

11. The image sensor of claim 10, wherein the cap layer comprises silicon nitride or silicon oxynitride.

12. The image sensor of claim 10, wherein the plurality of dielectric layers in the interconnect structure comprises an inter-layer (ILD) layer over the CESL, and an inter-metal (IMD) layer over the ILD layer.

13. The image sensor of claim 12, wherein the ILD layer comprises a first low-k dielectric material.

14. The image sensor of claim 13, wherein the IMD layer comprises a second low-k dielectric material that is the same as, or different from, the first low-k dielectric material.

15. The image sensor of claim 12, wherein the interconnect structure further comprises a plurality of contact plugs in the ILD layer and the CESL, the plurality of contact plugs electrically coupled to the photodiode.

16. The image sensor of claim 15, wherein the interconnect structure further comprises a plurality of metallization layers in the IMD layer, the plurality of metallization layer electrically coupled to the plurality of contact plugs.

17. The image sensor of claim 10, wherein the cap layer is on the sidewalls of the opening and a topmost surface of the interconnect structure.

18. An image sensor comprising:
a photodiode within a semiconductor substrate;
an interconnect structure over the semiconductor substrate, the interconnect structure comprising:
a contact etch stop layer (CESL),
a plurality of dielectric layers over the CESL, wherein at least one dielectric layer of the plurality of dielectric layers comprises a low dielectric constant (low-k) dielectric material; and
a plurality of metallization layers in the plurality of dielectric layers;
an opening extending through at least a portion of the interconnect structure; and
a cap layer on sidewalls of the opening, wherein the cap layer comprises a dielectric material having a higher moisture resistance than the low-k dielectric material.

19. The image sensor of claim 18, wherein a top surface of the CESL defines a bottom surface of the opening.

20. The image sensor of claim 18, wherein the opening extends through an entirety of the interconnect structure.

* * * * *